United States Patent
Roberts et al.

(10) Patent No.: US 9,064,947 B2
(45) Date of Patent: *Jun. 23, 2015

(54) ISLAND MATRIXED GALLIUM NITRIDE MICROWAVE AND POWER SWITCHING TRANSISTORS

(75) Inventors: John Roberts, Ottawa (CA); Ahmad Mizan, Ottawa (CA); Girvan Patterson, Ottawa (CA); Greg Klowak, Ottawa (CA)

(73) Assignee: GAN SYSTEMS INC., Ottawa, ON (CA)

( * ) Notice: Subject to any disclaimer, the term of this patent is extended or adjusted under 35 U.S.C. 154(b) by 0 days.

This patent is subject to a terminal disclaimer.

(21) Appl. No.: 13/388,694

(22) PCT Filed: Aug. 4, 2010

(86) PCT No.: PCT/CA2010/001202
§ 371 (c)(1),
(2), (4) Date: Feb. 21, 2012

(87) PCT Pub. No.: WO2011/014951
PCT Pub. Date: Feb. 10, 2011

(65) Prior Publication Data
US 2012/0138950 A1    Jun. 7, 2012

Related U.S. Application Data

(60) Provisional application No. 61/231,139, filed on Aug. 4, 2009.

(51) Int. Cl.
*H01L 29/778* (2006.01)
*H01L 29/10* (2006.01)
(Continued)

(52) U.S. Cl.
CPC ......... *H01L 29/7787* (2013.01); *H01L 29/1075* (2013.01); *H01L 29/2003* (2013.01); *H01L 29/4175* (2013.01); *H01L 29/41758* (2013.01); *H01L 29/42316* (2013.01)

(58) Field of Classification Search
CPC ............ H01L 29/1075; H01L 29/2003; H01L 29/4175; H01L 29/41758; H01L 29/42316; H01L 29/7787; H01L 2224/16; H01L 23/492; H01L 23/49844; H01L 23/50
USPC ................... 257/194, 76, 280, 613, 615, 192; 438/22
See application file for complete search history.

(56) References Cited

U.S. PATENT DOCUMENTS

| 3,783,349 A | 1/1974 | Beasom |
| 4,152,714 A * | 5/1979 | Hendrickson et al. ........ 257/341 |

(Continued)

FOREIGN PATENT DOCUMENTS

| CA | 2351368 A1 | 3/2001 |
| EP | 1973163 | 9/2008 |

(Continued)

OTHER PUBLICATIONS

Karmalkar et al., Enhancement of Breakdown Voltage in AlGaN/GaN High Electron Mobility Transistors Using a Field Plate, 2001, IEEE Transactions On Electron Devices, vol. 48, No. 8, p. 1515-1521.*

(Continued)

*Primary Examiner* — Bac Au
*Assistant Examiner* — Sophia Nguyen

(57) ABSTRACT

A gallium nitride (GaN) device that has greatly superior current handling ability per unit area than previously described GaN devices. The improvement is due to improved layout topology. The layout scheme, which uses island electrodes rather than finger electrodes, is shown to increase the active area density over that of conventional interdigitated structures. Ultra low on resistance transistors can be built using the island topology. Specifically, the present invention, which uses conventional GaN lateral technology and electrode spacing, provides a means to enhance cost/effective performance of all lateral GaN structures.

18 Claims, 7 Drawing Sheets

(51) Int. Cl.
  *H01L 29/20* (2006.01)
  *H01L 29/417* (2006.01)
  *H01L 29/423* (2006.01)

(56) References Cited

U.S. PATENT DOCUMENTS

| | | | |
|---|---|---|---|
| 4,636,825 A | 1/1987 | Baynes | |
| 4,819,042 A * | 4/1989 | Kaufman | 257/676 |
| 4,821,084 A | 4/1989 | Kinugasa et al. | |
| 5,068,603 A * | 11/1991 | Mahoney | 714/726 |
| 5,087,950 A * | 2/1992 | Katano | 257/472 |
| 5,355,008 A | 10/1994 | Moyer et al. | |
| 5,447,876 A | 9/1995 | Moyer et al. | |
| 5,633,479 A * | 5/1997 | Hirano | 174/255 |
| 5,643,832 A | 7/1997 | Kim | |
| 5,714,784 A | 2/1998 | Ker et al. | |
| 5,767,546 A | 6/1998 | Williams et al. | |
| 5,789,791 A | 8/1998 | Ergemont | |
| 5,852,315 A | 12/1998 | Ker et al. | |
| 5,883,407 A | 3/1999 | Kunii et al. | |
| 6,037,822 A * | 3/2000 | Rao et al. | 327/298 |
| 6,084,266 A | 7/2000 | Jan | |
| 6,100,549 A * | 8/2000 | Weitzel et al. | 257/194 |
| 6,159,841 A | 12/2000 | Williams et al. | |
| 6,264,167 B1 * | 7/2001 | Hamazawa | 251/288 |
| 6,353,290 B1 * | 3/2002 | Glenn et al. | 315/3 |
| 6,388,292 B1 | 5/2002 | Lin | |
| 6,477,023 B1 | 11/2002 | Tang et al. | |
| 6,555,873 B2 | 4/2003 | Disney et al. | |
| 6,639,277 B2 | 10/2003 | Rumennik et al. | |
| 6,653,740 B2 | 11/2003 | Kinzer et al. | |
| 6,713,793 B1 * | 3/2004 | Suzuki et al. | 257/276 |
| 6,713,823 B1 * | 3/2004 | Nickel | 257/401 |
| 6,737,714 B2 | 5/2004 | Masuda et al. | |
| 6,777,278 B2 | 8/2004 | Smith | |
| 6,878,593 B2 * | 4/2005 | Khan et al. | 438/285 |
| 6,897,561 B2 | 5/2005 | Nemtsev et al. | |
| 6,903,460 B2 | 6/2005 | Fukuda et al. | |
| 6,930,329 B2 | 8/2005 | Koide | |
| 6,958,543 B2 | 10/2005 | Nakayama | |
| 6,972,464 B2 | 12/2005 | Shen | |
| 7,033,936 B1 | 4/2006 | Green | |
| 7,078,775 B2 * | 7/2006 | Yi et al. | 257/401 |
| 7,132,717 B2 * | 11/2006 | Su et al. | 257/401 |
| 7,233,028 B2 | 6/2007 | Weeks et al. | |
| 7,233,610 B2 | 6/2007 | Lan et al. | |
| 7,250,641 B2 * | 7/2007 | Saito et al. | 257/192 |
| 7,253,486 B2 | 8/2007 | Green et al. | |
| 7,294,892 B2 | 11/2007 | Chen | |
| 7,327,007 B2 | 2/2008 | Shimizu | |
| 7,335,916 B2 | 2/2008 | Kim et al. | |
| 7,352,016 B2 | 4/2008 | Nagy et al. | |
| 7,398,498 B2 * | 7/2008 | Teig et al. | 716/129 |
| 7,449,762 B1 * | 11/2008 | Singh | 257/493 |
| 7,491,986 B2 | 2/2009 | Kumagae et al. | |
| 7,550,821 B2 * | 6/2009 | Shibata et al. | 257/615 |
| 7,622,318 B2 | 11/2009 | Kobayashi et al. | |
| 7,622,779 B2 * | 11/2009 | Cheng et al. | 257/401 |
| 7,675,131 B2 * | 3/2010 | Derderian | 257/432 |
| 7,727,332 B2 | 6/2010 | Habel et al. | |
| 7,732,306 B2 | 6/2010 | Arena et al. | |
| 7,750,369 B2 | 7/2010 | Ohta et al. | |
| 8,085,553 B1 * | 12/2011 | Lacap et al. | 361/813 |
| 8,134,205 B2 | 3/2012 | Tang et al. | |
| 8,680,676 B1 * | 3/2014 | Jergovic et al. | 257/737 |
| 2001/0015447 A1 | 8/2001 | Shinomiya | |
| 2002/0013042 A1 | 1/2002 | Morkoc | |
| 2002/0076851 A1 | 6/2002 | Eden et al. | |
| 2002/0179005 A1 | 12/2002 | Koike et al. | |
| 2002/0197841 A1 | 12/2002 | Nagai et al. | |
| 2003/0032288 A1 | 2/2003 | Kozaki et al. | |
| 2003/0062622 A1 * | 4/2003 | Pavier et al. | 257/734 |
| 2003/0136984 A1 | 7/2003 | Masuda et al. | |
| 2003/0183160 A1 | 10/2003 | Fujikura et al. | |
| 2003/0209759 A1 * | 11/2003 | Blanchard | 257/341 |
| 2003/0218246 A1 * | 11/2003 | Abe et al. | 257/734 |
| 2004/0048409 A1 | 3/2004 | Biwa et al. | |
| 2005/0056865 A1 | 3/2005 | Tsuchiya et al. | |
| 2005/0093099 A1 | 5/2005 | Koike et al. | |
| 2005/0167775 A1 | 8/2005 | Nagy et al. | |
| 2005/0274977 A1 | 12/2005 | Saito et al. | |
| 2006/0049204 A1 | 3/2006 | Li et al. | |
| 2006/0060895 A1 * | 3/2006 | Hikita et al. | 257/280 |
| 2006/0073621 A1 | 4/2006 | Kneissel et al. | |
| 2006/0273347 A1 * | 12/2006 | Hikita et al. | 257/192 |
| 2007/0072320 A1 * | 3/2007 | Frayssinet et al. | 438/22 |
| 2007/0096262 A1 * | 5/2007 | Takasone | 257/615 |
| 2008/0073670 A1 | 3/2008 | Yang et al. | |
| 2008/0083932 A1 * | 4/2008 | Briere | 257/192 |
| 2008/0087915 A1 | 4/2008 | Uemoto et al. | |
| 2008/0128752 A1 | 6/2008 | Wu | |
| 2008/0149940 A1 | 6/2008 | Shibata et al. | |
| 2008/0173898 A1 * | 7/2008 | Ohmaki | 257/194 |
| 2008/0224332 A1 * | 9/2008 | Tam | 257/786 |
| 2008/0230786 A1 * | 9/2008 | Heikman et al. | 257/76 |
| 2008/0246058 A1 | 10/2008 | Nagy et al. | |
| 2008/0274621 A1 * | 11/2008 | Beach et al. | 438/694 |
| 2008/0303042 A1 | 12/2008 | Minato et al. | |
| 2009/0026506 A1 * | 1/2009 | Matsumiya et al. | 257/272 |
| 2009/0045394 A1 | 2/2009 | Smeeton et al. | |
| 2009/0086506 A1 | 4/2009 | Okumura | |
| 2009/0242961 A1 * | 10/2009 | Tang et al. | 257/324 |
| 2009/0267188 A1 * | 10/2009 | Piner et al. | 257/613 |
| 2009/0315123 A1 * | 12/2009 | Wu | 257/403 |
| 2010/0019850 A1 * | 1/2010 | Nagy et al. | 330/277 |
| 2010/0059761 A1 * | 3/2010 | Horii et al. | 257/76 |
| 2010/0072489 A1 | 3/2010 | McLaurin et al. | |
| 2010/0072576 A1 | 3/2010 | Arena | |
| 2010/0133548 A1 * | 6/2010 | Arena et al. | 257/76 |
| 2010/0163979 A1 | 7/2010 | Hebert | |
| 2010/0258843 A1 | 10/2010 | Lidow et al. | |
| 2010/0297960 A1 | 11/2010 | Ogawa et al. | |
| 2011/0031529 A1 | 2/2011 | Miura et al. | |
| 2011/0031532 A1 | 2/2011 | Kikkawa et al. | |
| 2011/0041890 A1 * | 2/2011 | Sheats | 136/244 |
| 2011/0057311 A1 * | 3/2011 | Yutani | 257/737 |
| 2011/0079795 A1 | 4/2011 | Nagai | |
| 2011/0115029 A1 * | 5/2011 | Van Den Boom | 257/369 |
| 2011/0186858 A1 | 8/2011 | Roberts et al. | |
| 2011/0193096 A1 | 8/2011 | Imada | |
| 2012/0126290 A1 | 5/2012 | Uemoto et al. | |
| 2012/0138950 A1 | 6/2012 | Roberts et al. | |
| 2012/0315743 A1 | 12/2012 | Kikkawa et al. | |

FOREIGN PATENT DOCUMENTS

| | | |
|---|---|---|
| EP | 2151852 | 2/2010 |
| JP | 5047575 | 4/1975 |
| JP | 5089263 | 7/1975 |
| JP | 5181067 | 6/1976 |
| JP | 5868954 | 4/1983 |
| JP | 11214408 | 8/1999 |
| JP | 2000208759 A | 7/2000 |
| JP | 2007103451 | 4/2007 |
| JP | 2007305954 A | 11/2007 |
| JP | 2008177527 A | 7/2008 |
| WO | 2010015302 | 2/2010 |
| WO | 2011014951 A1 | 2/2011 |

OTHER PUBLICATIONS

Koudymov et al., Mechanism of Current Collapse Removal in Field-Plated Nitride HFETs, 2005, IEEE Electron Device Letters, vol. 26, No. 10, p. 704-706.*

Xing et al., High Breakdown Voltage AlGaN—GaN HEMTs Achieved by Multiple Field Plates, 2004IEEE Electron Device Letters, vol. 25, No. 4, p. 161-163.*

Wai Tung NG et al. High Speed CMOS output Stage for intergrated DC_DC Converters. Solid state and Intergrated Circuit Technology 2008. ICSICT 2009. pp. 1909-1912.

(56) References Cited

OTHER PUBLICATIONS

A. Yoo et al. High Performance Low_Voltage Powers MOSFETs with Hybrid Waffle Layout Structure in a 0.25 um Standard CMOS process. 20th International Symposium on Power Semiconductor Devices and ICs (ISPD '08). p. 95 (2008).

S. Lee. Distributed effects on power transistors and the optimization of the layouts of AlGaN/GaN HFETs, Doctoral dissertation, Graduate School of Ohio State University, Ohio State University. (2006).

Sang Lam et al. An enhanced compact waffle MOSFET with low drain capacitance from a standard submicron CMOS technology. Solid State Electronics 47(2003). Pergamon Press. pp. 785-789.

R. Vemuru. Layout Comparison of MOSFETs with large W/L ratios. Electronic Letters. vol. 28. No. 25. pp. 2327-2329. (1992).

L Baker et al. A waffle layout technique strengthens the ESD hardness of the NMOS transistor. EOS/ESD Symp. Proc. EOS-11. pp. 175-181. (1989).

Ming-Dou Ker et al. Area-Efficient Layout Design for CMOS Output Transistor. IEEE Transactions on Electron Devices. vol. 44, No. 4. Apr. (1997).

Notice of Reasons for Rejection, Japanese Patent Office, mailed Jul. 30, 2014.

\* cited by examiner

ISLAND MATRIXED GALLIUM NITRIDE MICROWAVE AND POWER SWITCHING TRANSISTORS

FIELD OF THE INVENTION

The invention relates generally to gallium nitride transistors and, more particularly, to performance improvement and yield enhancement methods associated with the same.

BACKGROUND OF THE INVENTION

Gallium nitride materials include gallium nitride and its alloys such as aluminum gallium nitride, indium gallium nitride and aluminum indium gallium nitride. These materials are semiconductor compounds that have a relatively wide, direct bandgap, which permits highly energetic electronic transitions to occur. Gallium nitride materials have a number of attractive properties including high electron mobility, the ability to efficiently emit blue light and the ability to transmit signals at high frequency, among others. Accordingly, gallium nitride materials are being investigated in many microelectronic applications such as transistors and optoelectronic devices.

Despite the attractive properties noted above, a number of challenges exist in connection with developing gallium nitride material-based devices. For example, it may be difficult to grow high quality gallium nitride materials on certain substrates, particularly silicon, due to property difference (e.g., lattice constant and thermal expansion coefficient) between the gallium nitride material and the substrate material. Also, it has been challenging to form gallium nitride material devices meeting the cost requirements for certain applications.

High power and medium power gallium nitride microwave transistors are now available and all types use a multifinger structure. Some of the power switching devices described in the research literature also use multifinger structures. Alternative new matrix island based structures are shown herein and these confer significant advantages in all switching applications. Following the practice of all power transistors, the structures are optimized for grounded source circuit applications where it is desirable to minimize the inductance and resistance of the source connection. To this end the transistors are commonly constructed with a series of via connections that subtend the entire vertical structure. These commonly used through-substrate via connections are difficult to manufacture and control. To reach the areas where smaller number of large vias can be made, air bridges may have to be constructed from each of the source connections. See, for example, U.S. Pat. No. 7,352,016 B2. However, air bridges are a source of manufacturing and handling problems.

U.S. Pat. No. 7,550,821 B2 (Shibata et al.) discloses a nitride semiconductor device in which air bridges are eliminated altogether. A plurality of first electrodes and a plurality of second electrodes are formed (spaced apart from each other) on an active region in a nitride semiconductor layer (which is formed on a main surface of a substrate). An interlayer insulating film is formed on the nitride semiconductor layer. The interlayer insulating film has openings that respectively expose the first electrodes and has a planarized top surface. A first electrode pad is formed in a region over the active region in the interlayer insulating film and is electrically connected to the exposed first electrodes through the respective openings. While the source-substrate contacts (short vias) are placed adjacent to the active areas and are directly connected to the source electrodes, there is an area increase penalty in this multifinger structure. As such, the nitride semiconductor device of Shibata et al. is also accordingly limited by the high on-resistance typical of power switching transistors using conventional multifinger structures.

U.S. Pat. No. 7,250,641 B2 (Saito et al.) discloses a nitride semiconductor device that comprises: a silicon substrate; a first aluminum gallium nitride layer formed as a channel layer on the silicon substrate in an island shape; and a second aluminum gallium nitride layer formed as a barrier layer of a first conductive type or i-type on the first aluminum gallium nitride layer. The islands disclosed therein are completely isolated from each other with no common gate electrode between them; each island is thus a separate device. The embodiments disclosed by Saito et al (e.g. as in FIG. 1) require the juxtaposition of three source electrodes, island to island. The island concept disclosed by Saito et al, serves only as a separation of isolated devices; i.e. there is no intrinsic mode of operation invoked between the islands.

The new topology described herein eliminates source connection air bridges and allows the gate electrode to be tracked in up to two additional directions leading to an on-resistance reduction of 1.5 to 5 times compared with conventional multifinger structures. In this way the large area requirements of ladder (or multifinger structures) are eliminated.

A few examples of the present invention may be based upon relatively complex silicon based templates. However this, together with the new island based surface topologies, greatly simplify the costly gallium nitride device process steps.

SUMMARY OF THE INVENTION

The invention in its general form will first be described, and then its implementation in terms of specific designs will be detailed hereafter. These embodiments are intended to demonstrate the principle of the invention, and the manner of its implementation.

The present invention eliminates the air bridges that are well known to cause power transistor manufacturing and handling difficulties. Both the older gallium arsenide devices and the newer gallium nitride devices suffer yield losses. The present invention provides a topology that in one realization uses a multiplicity of small short vias that make air bridges or through substrate source electrode via connections mechanisms unnecessary. Sources and drains are made to consist only of islands that are reduced in size sufficiently only to allow the positioning of a ball grid or/and via grid within each source and drain. By this unique means bonds are eliminated as well as air bridges.

According to an aspect of the present invention, there is provided a nitride semiconductor device comprising: a substrate; a nitride semiconductor layer formed on a main surface of the substrate; a plurality of source island electrodes and a plurality of drain island electrodes spaced apart from each other so as to be arranged with alternating source island electrodes to produce two-dimensional active regions in areas of the nitride semiconductor layer, with at least one side of each of the source island electrodes opposite a side of an adjacent drain island electrode; at least one side of each of the drain island electrodes opposite a side of an adjacent source island electrode; a plurality of gate electrodes formed on the nitride semiconductor layer in regions between each of the source island electrodes and each of the drain island electrodes, the plurality of gate electrodes being interconnected by an interconnection at each interstice defined by adjacent vertices of the source island electrodes and the drain island electrodes; and a plurality of source connections connected to the plurality of the source island electrodes, each source connection comprising a first ball connection, with a respective first ball connection associated with each source island electrode; a plurality of drain connections connected to the plurality of the drain island electrodes, with each drain connection comprising a respective second ball connection associated with each drain island electrode; and a plurality of gate pads connected to the plurality of gate electrodes. Where the substrate is conductive, the ball connection on the surface of each source electrode may be replaced by a via. The ball connection is preferably formed of gold, while the nitride semiconductor layer is preferably a hetero layer consisting of a layer of undoped gallium nitride beneath a layer of undoped aluminum gallium nitride.

The island electrodes are preferably each a four-sided figure, or preferably triangular shaped. Alternatively, the islands may be a combination of various variants of polygon shapes that allow drain/source juxtapositioning. Each gate electrode is preferably attached to a gate pad using a low-resistance means, such as (but not limited to) a metal strap. In addition, the nitride semiconductor device may further comprising one or more epitaxial layers in between the substrate and the nitride semiconductor layer. Each of the epitaxial layer is lightly doped. Field plates may be inserted within the epitaxial layers.

In the present invention, source island electrodes are always juxtaposed with drain island electrodes, and a gate always exists between them.

Where it is desirable to use an insulative substrate, the via can be eliminated and replaced by a ball grid identical to that used for the drain islands. The islands, if are each a four-sided figure possessing a two-fold or four-fold symmetry, this allows the gate to run in two directions; if the islands are triangular, then the gate can be run in three directions. As a result the gate track can be much larger for a given dice size. The multifinger structure can be abandoned and sources and drains made to consist only of islands.

The island topology disclosed herein, preferably triangular or rectangular island structures, provide numerous advantages over the common multi-finger or interdigitated structure. These island topologies result in the specific transistor resistance being less than 70% of those achieved by equivalent-area multi-finger layouts. More significantly, the effective overall device area ratios are 3 to 5 times superior because of the reduced surface interconnect and pad requirements.

The present invention provides a device with a larger gate width (or "Wg") within a given active area. In certain exemplary embodiments, the topologies provide a great increase in the current handling capability per unit overall device area, rather than just within the active area. In addition, there is provided a simple process to fabricate extremely capable GaN semiconductor devices.

Another inventive aspect of this invention relates to the design of the field plates buried within various epitaxial layers. Because the silicon conductive substrate will produce unwanted increases in the capacitance of the active regions, a lightly doped singular, dual or a series of epitaxial layers of intrinsic silicon material (lightly doped) can be grown on the substrate. The thickness of this or these layers can be varied and a buried conductive layer or a series of layers can be inserted to act as buried field plates. Multiple field plates of various sizes and shapes can be introduced. These field plates reduce the peak electric field near the gate edge that is juxtaposed to the drain and therefore increases the maximum voltage that the transistor can withstand. In addition, these field plates can be arranged to provide a very even distribution of the electrical stress between the gate edge and the drain edge. A unique and exceptionally linear or very high voltage device can be constructed. The novel vertical epitaxial silicon based structure can in addition assist with problems related to the mechanical stresses that arise due the disparity between the thermal expansion of silicon and gallium nitride.

The foregoing and other aspects of the present invention will become apparent from the following detailed description of the invention when considered in conjunction with the accompanying drawings.

Wherever ranges of values are referenced within this specification, sub-ranges therein are intended to be included within the scope of the invention unless otherwise indicated. Where characteristics are attributed to one or another variant of the invention, unless otherwise indicated, such characteristics are intended to apply to all other variants of the invention where such characteristics are appropriate or compatible with such other variants.

The following is given by way of illustration only and is not to be considered limitative of this invention. Many apparent variations are possible without departing from the spirit and scope thereof.

DETAILED DESCRIPTION

Figure 1:
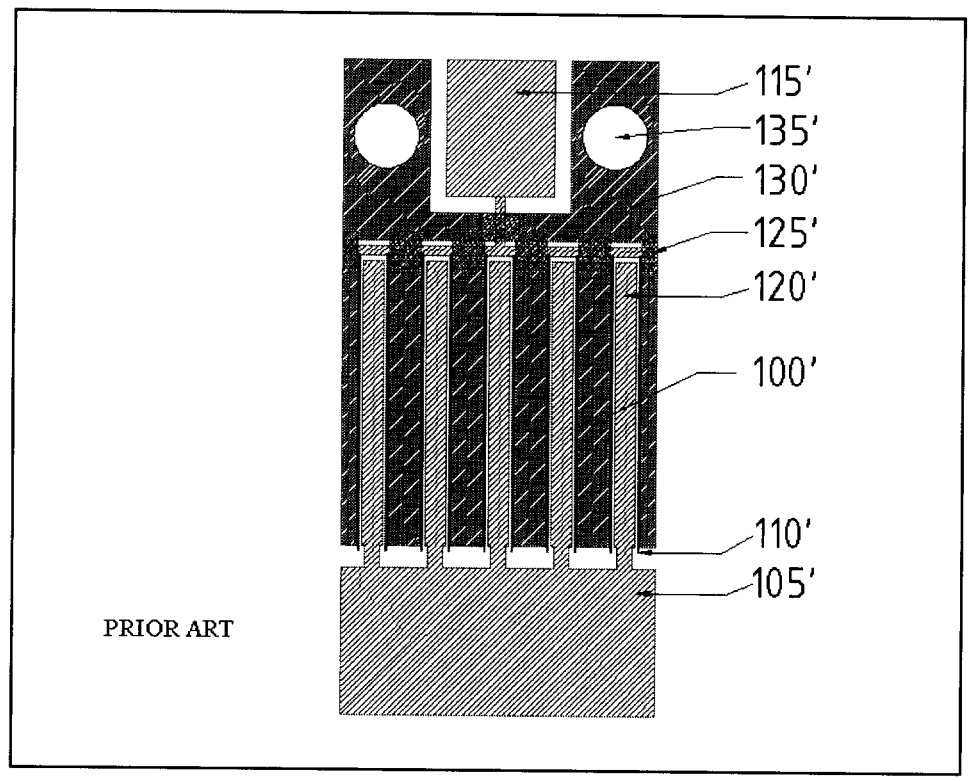
FIG. 1 illustrates a plan view example of a prior art building block structure.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer template and substrate used in the following description include any structure having an exposed surface with which to form the circuit structure of the invention. The terms substrate or template are understood to include semiconductor wafers. The terms substrate or template are also used to refer to semiconductor structures during processing, and may include other layers that have been fabricated thereupon. Wafers, templates and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The accompanying figures are schematic and are not intended to be drawn to scale. For purpose of clarity, not every component is labeled in every figure. All patent applications and patents incorporated herein by reference are incorporated by reference in their entirety. In case of conflict, the present specification, including definitions, will control.

The field of the invention pertains generally to high and medium power gallium nitride transistors. More specifically, the invention relates to the transistors that operate at high temperatures where large gallium nitride devices have thermal gradients that impair performance. The connection system for each source and/or drain includes a separate thermal sink. Since all large gallium nitride transistors have a plurality of source/drain electrodes, the schema described allows each source and drain connection to be separately compensated, both resistively and thermally, depending on the particular position of these connections in the overall complex structure of the transistor.

In cases where the base substrate is heavily doped, the small, short vias are able to provide a low resistance connection to the back of the wafer. The wafer doping level can be chosen to tailor the resistance to the particular needs of every type of transistor. Wafers that are heavily doped enable the formation of positive temperature coefficient resistors that operate reliably over temperature ranges extending to 600° K. Positive temperature coefficient can be chosen to be between 0.11% per ° K and 1.1% per ° K using wafer doping levels between 10E16 $cm^{-3}$ and 10E18 $cm^{-3}$. The small, short via can be varied in length, depth and/or width to provide appropriate compensation.

Alternatively where very high temperature (higher than 600° K) and very high performance short term operation is required the resistor temperature coefficients can be chosen so that they reach as low as 10% of their room temperature value. Operation in this alternative mode will counteract the natural tendency of gallium nitride devices to reduce their performance at higher temperatures. Transition temperatures from positive to negative temperature coefficients can be chosen between 600° K and 900° K. While this negative temperature coefficient of resistance is not generally valuable, it is possible to use gold or another suitable dopant to achieve a negative temperature coefficient. The new structure and layout may be used and a suitably employed to provide a series source resistance that has a negative temperature coefficient. It is possible therefore to build a gallium nitride transistor based on the schema proposed herein that exhibits very stable performance over a wide temperature range from below 300° K to over 600° K. Extremely simple bias methods and very stable, linear performance may be obtained. However the device design difficulty centers around the problem of balancing the positive effects of the source resistance reduction versus the declining performance of the typical of the intrinsic gallium nitride transistors as the temperature increases.

In addition to the forgoing novel lateral topology attributes, the vertical arrangements described herein have aspects that notably contribute to the performance of the fabricated transistors. It is known that heavily doped substrates have disadvantages associated with the drain-source and channel-source capacitance. This higher capacitance arises from the fact that the substrate acts as one plate of a capacitor. To obviate the effects of this, a very lightly doped substrate has been used typically. Some of the designs described herein however require a heavily doped bulk substrate. To reduce the capacitance effect another aspect of the vertical structure proposed herein is the novel inclusion of a very lightly doped epitaxial layer or a series of epitaxial layers grown upon the substrate in such a way that an idealized interfacial structure is maintained. Since subsequent process steps involve difficulties related to the massive differences in terms of lattice constant (17%) and expansion coefficient between gallium nitride and silicon, the process steps involving the epitaxial layer or layers is critical. The present invention provides for a strained layer super lattice, which may assist with the further growth of GaN/AlGaN heterolayers. High quality GaN/AlGaN heterolayers can be grown over the epitaxial layer or layers by inserting a GaN AlN super lattice over an AlN buffer layer directly grown on the epitaxial layer or layers. The epitaxial layer or layers can be grown to extend, for example, over a thickness range of 3 to 20 microns. When microwave transistors are fabricated the smaller capacitance is preferred since it can be chosen to be part of the required matching network. However this will require the capacitance to be a minimum and the required epitaxial layer thickness will be at a maximum. The 20-micron dimension may be extended to further reduce the capacitance.

It is known that it is important to reduce the electric field stress at gate edge. It has become common practice to extend the drain side of the gate edge over the SiN or other surface passivation. In some realizations, devices with a drain-gate spacing of 2.5 micron have a surface field plate extended 1.0 micron from the gate toward the drain. This extension results in an unwanted increase in gate-drain feedback capacitance. This noticeably reduces the gain of the device. Alternative schemes involve a metal field plate connected to the source and placed over the gate. The new proposed structures described herein employ a source connected buried layer that extends below the gate to the gate edge (or beyond) facing the drain. Further gains in field stress reduction arise from the conductive substrate below the epitaxial layer. Each or any of the epitaxial layers, where several are used, may contain a buried layer acting as a field plate below the gate. The combination of a buried field plate or plates and the conductive substrate obviates the absolute need for metal surface mounted field plates. The combination of surface field plates and the proposed buried field plates will provide very high breakdown voltage performance. It is possible, where the epitaxial layer is thin that a buried layer field plate is not required resulting in a simplified process. A choice can be made between reducing drain-source capacitance or alternatively reducing the field stress, resulting in an ideal epitaxial thickness of each transistor application.

The reduced peak electric field for the transistor device of the present invention compared to a simple transistor device results from reduced field crowding at the drain side edge of the gate electrode. This reduction is attributed to the singular or combinational effects of the novel field plates that act to provide the same stress reduction or additional stress reduction that surface field plates provide. The stress reduction leads to improved electrical performance characteristics including increased operation voltage and/or reduced gate leakage current.

Gallium nitride has a different crystal structure than silicon and when gallium nitride structure is formed on silicon substrates, dislocations may result. Defects and dislocations that are in the vicinity of an active region can greatly impair device performance. Because of the novel layout style of the proposed devices, it is possible to electrically isolate defective individual transistors and remove them from the main structure. Either the gate connection of the defective device can be disconnected or the drain connection or both. In the particular case of a normally-off transistor it may be sufficient to just disconnect the gate electrode. The disconnection mechanism could be based on a fuse or laser methodology. Owing to the leakage current or capacitive coupling involved, it may be additionally necessary to ground the gate electrode to the source electrode. A metal-to-metal short circuit can be achieved with a high-energy laser.

In the conventional design used in prior art (FIG. 1), the source electrodes 100 are connected by air bridges 125 to source pads 130, which are further, connected by a large via 135. As shown the drain electrodes 120 are connected to a common drain pad 105; and the gate electrodes 110 are connected to a common gate pad 115. In these illustrative unit cells, ten gate electrodes are connected to the gate pad and five drain electrodes are connected to the drain pad. In addition the large via is required to make a connection to the back of the substrate (not shown). In this case, the area required for the nitride semiconductor device is about three times as large as the area of an active region 130 (the area in which source, drain and electrodes are located). It is possible to reduce the size of an electrode pad, but such reduction in size of the electrode pad is limited in view of the yield.

Figure 2:
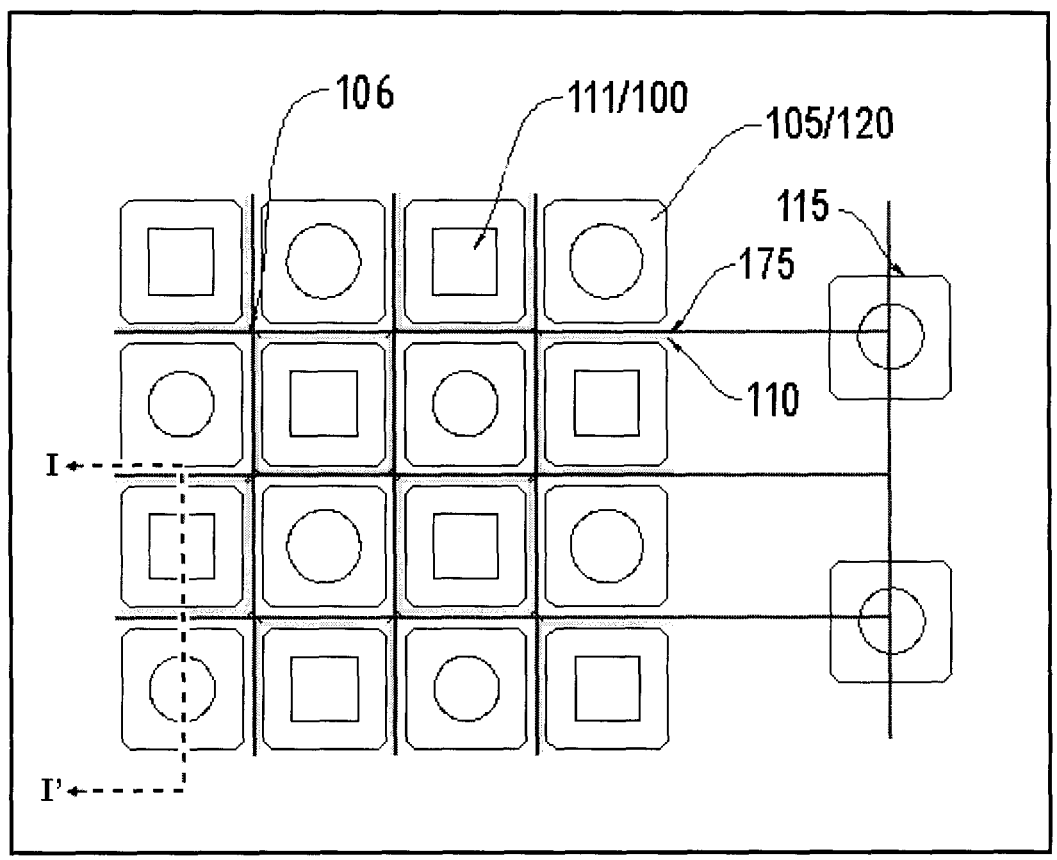
FIG. 2 illustrates a plan view of an embodiment of the present invention.

FIG. 2 illustrates a unique topology, where the adjacent positioning of the substrate contacts (short vias) does not impair the active area density. In this topology, the gate width is greatly increased for a given active area because the gate runs in two dimensions. There are no limitations, except breakdown voltage and line width limits, upon the on-resistance that can be achieved by this topology. Here, each source electrode (100) is accompanied by a via (111); each source electrode (100) is surrounded by an adjacent drain electrode (120). Each drain electrode (120) is accompanied by a drain bump (105), which is often a conventional ball made of gold. The gate electrode is shown as 110, which is connected to a gate strap (175) by a contact (106). The gate strap (175) also connects to a gate pad (115). In this manner, each island electrodes has its own pad, thereby reducing the size of the overall device. The islands, or tiles, shown in FIG. 2, are an embodiment of an overall feature wherein source and drain electrodes must alternate in a two-dimensional topology. The source electrode (100) and the drain electrode (120) are preferably formed from titanium and aluminum. The gate electrode (110) is preferably formed from palladium.

Figure 3:
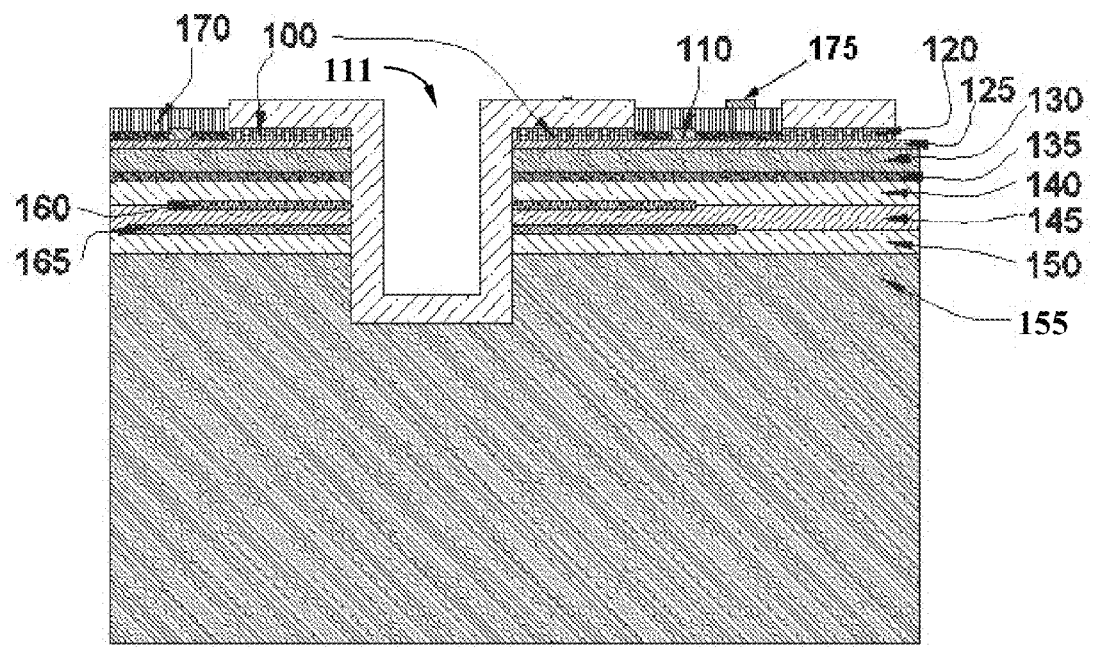
FIG. 3 illustrates a cross section taken along the line I-I' of FIG. 2

FIG. 3 illustrates a cross-sectional view taken along I-I' of FIG. 2. A substrate (155), preferably made of silicon, forms a base upon which successive insulating epitaxial layers 150, 145, and 140 are deposited. A buffer layer (135) is deposited upon the epitaxial layer (140), upon which an undoped gallium nitride layer (130) is deposited. A final undoped layer of aluminum gallium nitride (125) is deposited upon layer 130. Within the three epitaxial layers 150, 145, and 140 are two field plates 160 and 165, which are conductive in nature. These are preferably formed of a dopant of silicon. The source electrode is shown as 110, which has via (111) thereon, while a drain electrode is shown at 120. A gate electrode 110 sits in between the source electrode (100) and the drain electrode (120), upon which is a layer of dielectric (170), preferably silicon nitride. A gate strap (175) is shown atop the layer 170.

The rectangular equivalent shown in FIG. 2 may be replaced by any four-sided figure without losing the advantages stated. The rectangle can be rotated and an alternative use of the rectangle, for example, is shown in FIG. 5.

Figure 4:
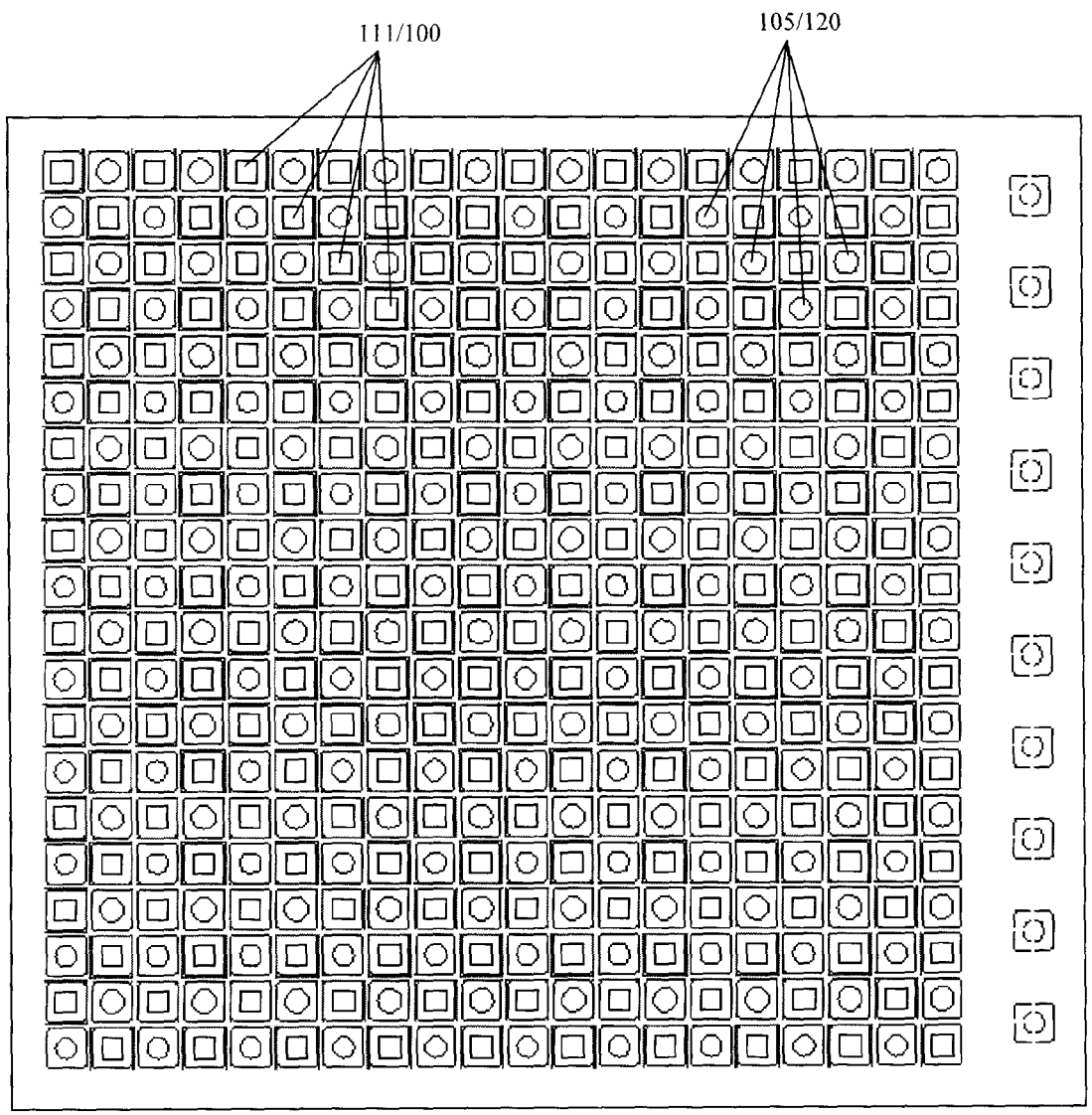
FIG. 4 illustrates a plan view of the embodiment shown in FIG. 2.
Figure 5:
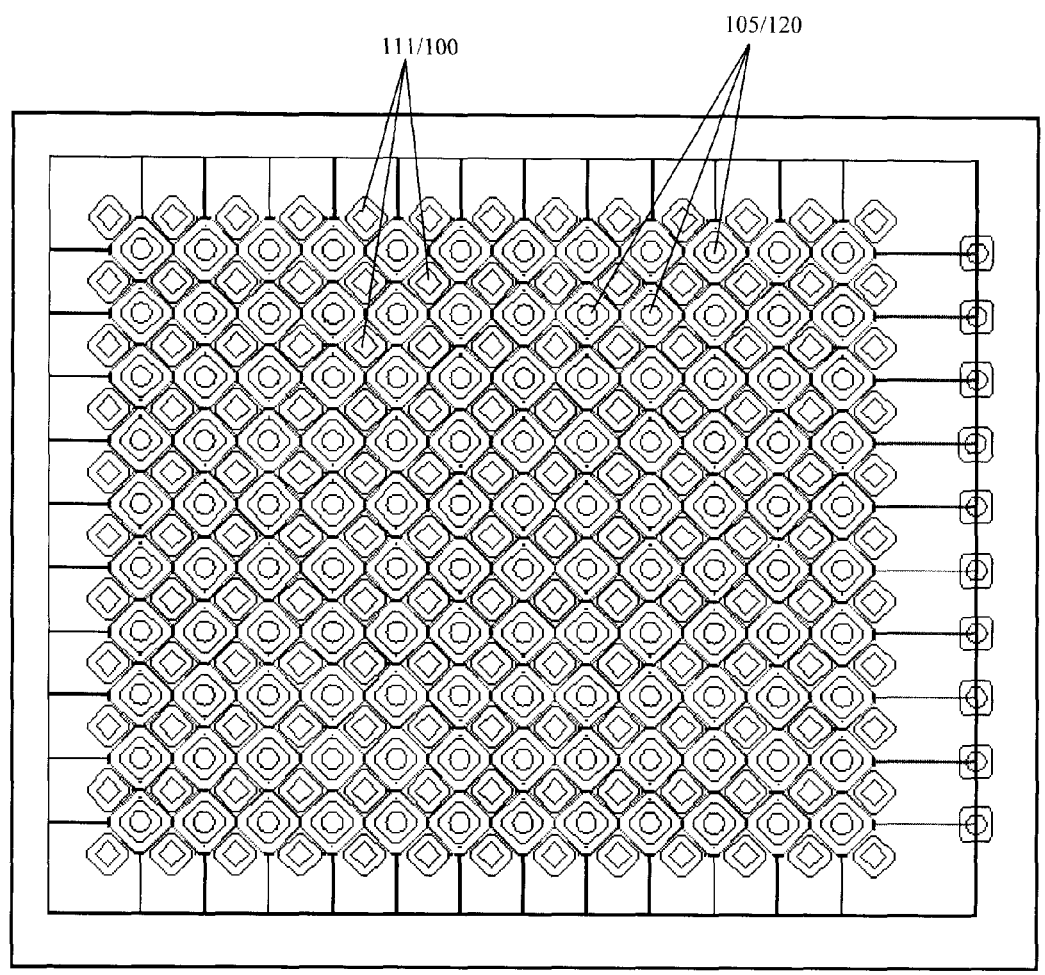
FIG. 5 illustrates a plan of a second embodiment of the present invention.

These two-dimensional tiled layouts shown in FIGS. 4 and 5 are extremely advantageous because they allow for increased gate width. In both FIGS. 4 and 5, the source electrodes and vias are shown as 100 and 111 respectively, while the drain electrodes and ball connections are shown as 120 and 105, respectively. The gate is run in both directions. The active useful gate width is not however doubled since some active area is lost in the transition between individual island devices. In practice, compared with multifinger device layouts, the island topologies of FIGS. 4 and 5 have been found to provide 1.5 to 1.7 times the gate width. The on-resistance of such devices is proportionately lowered.

Figure 6:
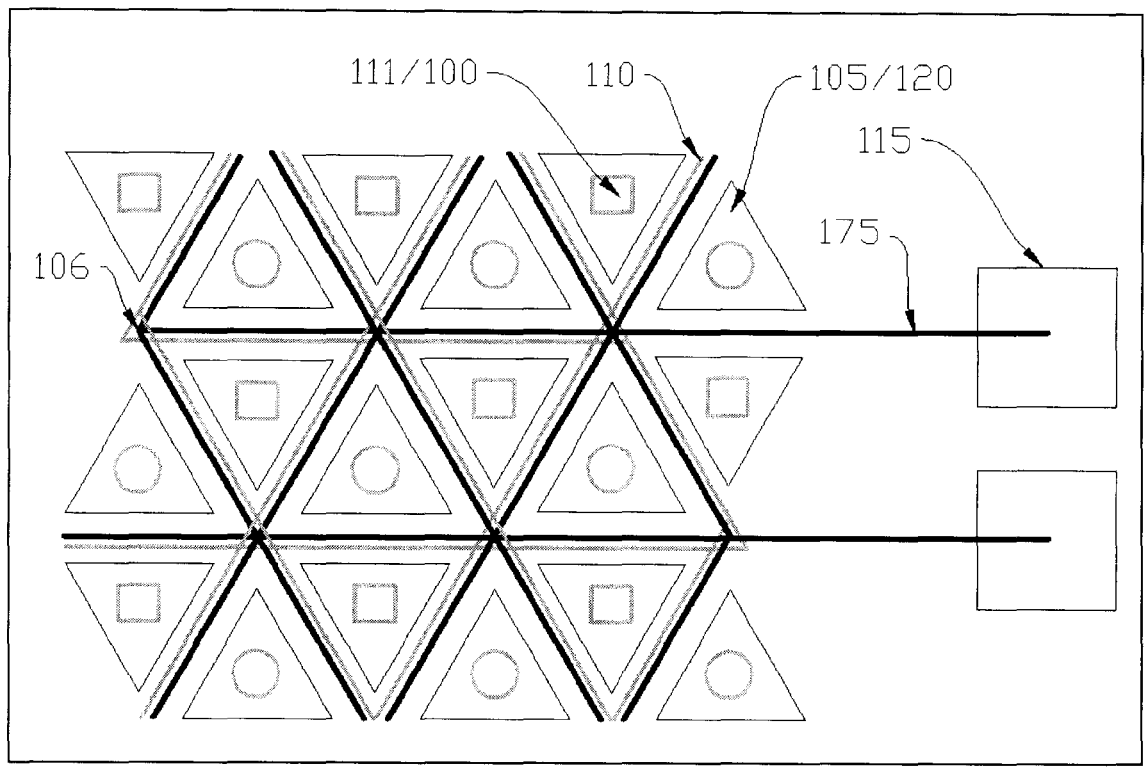
FIG. 6 illustrates a plan view of a third embodiment of the present invention.

It is possible to also enhance the gate width by running the gate in three directions. This is shown in the island layout of FIG. 6 where a unique equilateral triangle island is used. The triangle can however be of any format and the concept of running the gate in three directions is not limited to the convenient equilateral triangle layout shown. In practice this layout also provides approximately 1.5 to 1.7 times the gate width obtained by using interdigitated (or multifingered) structures of the prior art. As in FIG. 2, a via (111) is placed on top of a source electrode (100), while a ball connection (105) is atop a drain electrode (120). The fuse/antifuse (106) serves to join a gate electrode (110) with a gate strap (175); the gate strap (175) connects to a gate pad (115).

Based on design rules where the gate length is 0.5 microns, the drain-source spacing is 2.5 microns, there are 7.5 micron drain/source features and where the active area is 7.5 mm$^2$, the respective gate widths are: interdigitated, 0.7 meters, rectangular island, 1.1 meters, and triangular island, 1.1 meters. A GaN transistor with a 1.4 meter gate width can therefore be made using dice size of less than 3 mm×3 mm. Such a device will have an on-resistance of 10-15 milliohms and will be capable of switching 100 Amperes.

The island topology allows for the spaces between active devices to be used as connection points. By using a low unit resistance metal strap 175 the problem of metal gate resistance can be eliminated. The strap can be placed to act as an auxiliary field plate by positioning it separate from the gate as it transits the active gate-drain channel area. This is shown in FIG. 2 and FIG. 3.

To use the strap only to connect to good functional individual cells, contact 106 at the gate corners is available. A yield improvement is also possible by isolating individual drains by gold bump removal or absence. Even in the presence of large defect densities it is therefore possible to produce viable functional devices using the layout shown in FIG. 2. No provisions for conventional bonds or packages are shown in FIGS. 2, 4, 5 and 6. An alternative advantageous packaging technique is shown in a cross-section view in FIG. 7. The absence of air bridges allows the dice (200) to be eutectically bonded (via a eutectic bond (205)) to the copper/source heatsink clip (210). This can be inverted to allow the gold bump gate (215) and drain (220) connections to be made directly to copper tracks (225) on a multichip assembly. This arrangement greatly reduces the overall area of the mounted device compared to packages that use wire bonds and reduces the inductance of the drain and source connections.

Alternatively, all of the heat dissipation can be removed through the copper track on board, and the copper/source heatsink clip removed. To achieve this result, the drain, the source and the gate connections all have gold bumps, no via connections, and an insulative high resistance substrate is used.

Figure 7:
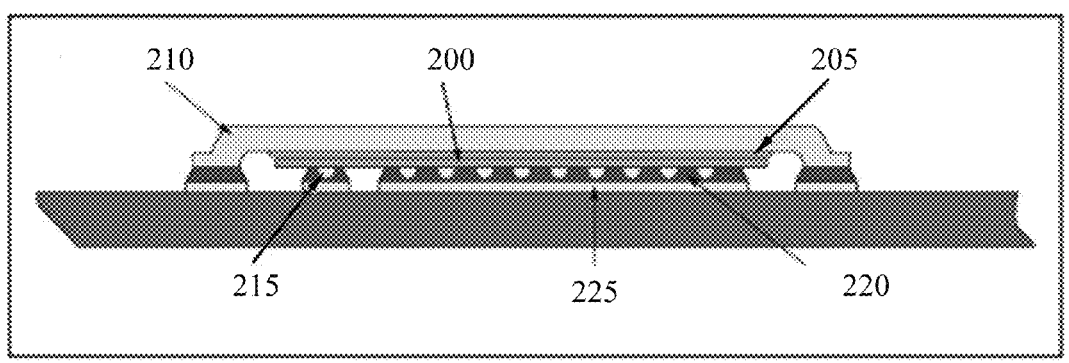
FIG. 7 illustrates packaging of the embodiment shown in FIG. 4.

It is common practice to thin the wafers of power R.F. devices from about 450 microns to 150 microns to lower the thermal resistance. In a packaged device, shown in FIG. 7, the dice is thinned to 50 microns to achieve lower series resistance to the source connection. The package shown in FIG. 7 is used to mechanically strengthen the dice and to ensure that a low inductance connection to the source is obtained.

The foregoing has constituted a description of specific embodiments showing how the invention may be applied and put into use. These embodiments are only exemplary. The invention in its broadest, and more specific aspects is further described and defined in the claims which now follow.

The invention claimed is:

1. A nitride semiconductor device comprising:
   a) a substrate;
   b) a nitride semiconductor layer comprising a nitride semiconductor hetero-layer formed on a main surface of the substrate;
   c) a plurality of source island electrodes and a plurality of drain island electrodes of a multi-island transistor formed on the nitride semiconductor layer, the source island electrodes and drain island electrodes being spaced apart from each other and arranged with alternating source island electrodes and drain island electrodes along at least two different axial directions to produce two-dimensional active regions in a device area of the nitride semiconductor layer, with:
      i) at least one side of each of the source island electrodes opposite a side of an adjacent drain island electrode;
      ii) at least one side of each of the drain island electrodes opposite a side of an adjacent source island electrode;
   d) a plurality of gate electrodes formed on the nitride semiconductor layer in active regions between each of the source island electrodes and each of the drain island electrodes, an overlying low resistance gate interconnect running between the source island electrodes and drain island electrodes, the plurality of gate electrodes being interconnected to the low resistance gate interconnect by interconnections at interstices defined by adjacent vertices of the source island electrodes and the drain island electrodes;
   and
   e) each of the plurality of source island electrodes having a respective individual source contact area (pad) comprising a bump or ball connection formed thereon;
   f) each of the plurality of drain island electrodes having a respective individual drain contact area (pad) comprising a bump or ball connection formed thereon;
   and
   g) the low resistance gate interconnect being connected to a plurality of gate pads.

2. The device of claim 1, wherein the drain and source island electrodes are each a four-sided figure.

3. The device of claim 1, wherein the drain and source island electrodes are triangular shaped.

4. The device of claim 1, wherein the drain and source island electrodes are a combination of various variants of polygon shapes that allow drain/source island juxtapositioning.

5. The device of claim 1, wherein the low resistance gate interconnect comprises a low resistance metal strap connecting each of the plurality of gate electrodes to the plurality of gate pads.

6. The device of claim 1, further comprising one or more epitaxial layers in between said substrate and said nitride semiconductor layer.

7. The device of claim 6, wherein said one or more epitaxial layers are lightly doped.

8. The device of claim 6, further comprising a plurality of epitaxial layers and one or more field plates, wherein each said field plate is positioned between successive epitaxial layers.

9. The device of claim 1, wherein each of the said first and second ball connections is formed of gold.

10. The device of claim 1 wherein the nitride semiconductor layer is a hetero layer consisting of a layer of undoped gallium nitride beneath a layer of undoped aluminum gallium nitride.

11. The device of claim 1, wherein each of the gate electrodes is formed from palladium, and source and drain island electrodes are made from titanium and aluminum.

12. The device of claim 1, wherein the substrate is an insulative high resistance substrate, and the gate connections further comprise bump or ball connections on the gate pads.

13. The device of claim 12 further comprising a package, and wherein each of the plurality of source, drain and gate bump or ball connections are directly bonded to respective copper tracks of the package.

14. The device of claim 1 wherein the source island electrodes and drain island electrodes are substantially square shaped and said ball or bump connections are centred on each island.

15. A nitride semiconductor device comprising:
   a) a conductive substrate;
   b) a nitride semiconductor layer comprising a nitride semiconductor hetero-layer formed on a main surface of the substrate;
   c) a plurality of source island electrodes and a plurality of drain island electrodes of a multi-island transistor formed on the nitride semiconductor layer, the source island electrodes and drain island electrodes being spaced apart from each other and arranged with alternating source island electrodes and drain island electrodes along at least two different axial directions to produce two-dimensional active regions in a device area of the nitride semiconductor layer, with:
      i) at least one side of each of the source island electrodes opposite a side of an adjacent drain island electrode;
      ii) at least one side of each of the drain island electrodes opposite a side of an adjacent source island electrode;
      and
   d) a plurality of gate electrodes formed on the nitride semiconductor layer in active regions between each of the source island electrodes and each of the drain island electrodes, an overlying low resistance gate interconnect running between the source island electrodes and drain island electrodes, the plurality of gate electrodes being interconnected to the low resistance gate interconnect by interconnections at interstices defined by adjacent vertices of the source island electrodes and the drain island electrodes; and
   e) each of the plurality of source island electrodes having a respective individual source contact area (pad) comprising a via connection to the conductive substrate;
   f) each of the plurality of drain island electrodes having a respective individual drain contact area (pad) comprising a bump or ball connection formed thereon;
   and
   h) the low resistance gate interconnect being connected to a plurality of gate pads.

16. The device of claim 15 further comprising a copper thermal heat sink bonded to the backside of the conductive substrate in electrical contact therewith, and wherein the copper thermal heat sink provides a backside source connection.

17. The device of claim 16 further comprising a package and wherein the gate connections comprise bump or ball connections on the gate pads and wherein the drain bump or ball connections and the gate bump or ball connections are directly bonded to respective copper tracks of the package.

18. The device of claim 15 wherein the source island electrodes and drain island electrodes are substantially square shaped, and said ball or bump connections or via connections are centred on each island.

* * * * *